(12) United States Patent
Pala

(10) Patent No.: US 11,069,804 B2
(45) Date of Patent: Jul. 20, 2021

(54) INTEGRATION OF HVLDMOS WITH SHARED ISOLATION REGION

(71) Applicant: Alpha and Omega Semiconductor (Cayman) Ltd., Grand Cayman (KY)

(72) Inventor: Vipindas Pala, San Jose, CA (US)

(73) Assignee: Alpha and Omega Semiconductor (Cayman) Ltd., Grand Cayman (KY)

( * ) Notice: Subject to any disclaimer, the term of this patent is extended or adjusted under 35 U.S.C. 154(b) by 0 days.

(21) Appl. No.: 16/119,797

(22) Filed: Aug. 31, 2018

(65) Prior Publication Data

US 2020/0075759 A1 Mar. 5, 2020

(51) Int. Cl.
*H01L 29/66* (2006.01)
*H01L 29/78* (2006.01)
(Continued)

(52) U.S. Cl.
CPC ........ *H01L 29/7816* (2013.01); *H01L 29/063* (2013.01); *H01L 29/1095* (2013.01);
(Continued)

(58) Field of Classification Search
CPC ............. H01L 29/7817; H01L 29/7824; H01L 29/66689; H01L 29/063; H01L 29/401; H01L 29/1095; H01L 29/402; H01L 29/404; H01L 29/405; H01L 29/408; H01L 29/41; H01L 29/06; H01L 29/0603; H01L 29/0607; H01L 29/0623; H01L 29/0634; H01L 29/0638; H01L 29/0642; H01L 29/0657; H01L 29/0692; H01L 29/08; H01L 29/7801; H01L 29/7816–7826; H01L 29/7833; H01L 29/0696; H01L 29/66674; H01L 29/66681–66704; H01L 21/266; H01L 21/26513; H01L 2924/1306;
(Continued)

(56) References Cited

U.S. PATENT DOCUMENTS

| 6,909,143 B2 * | 6/2005 | Jeon ..................... H01L 29/0634 |
| | | 257/335 |
| 9,064,738 B2 | 6/2015 | Brunt et al. |

(Continued)

OTHER PUBLICATIONS

Kazuhiro Shimizu and Tomohide Terashima, "The 2nd Generation divided RESURF structure for High Voltage ICs", in Proceedings of the 20th International Symposium on Power Semiconductor Devices & IC's May 18-22, 2008 Oralando, FL.

(Continued)

*Primary Examiner* — Natalia A Gondarenko
(74) *Attorney, Agent, or Firm* — JDI Patent; Joshua D. Isenberg; Robert Pullman

(57) ABSTRACT

A power device, comprising, a semiconductor substrate composition having a substrate layer of a first conductivity type, one or more lateral double diffused metal oxide semiconductor (LDMOS) devices formed in the substrate layer. LDMOS structures are integrated in to the isolation region of a high voltage well. Each LDMOS is isolated from a power device substrate area by an isolator structure formed from the substrate layer. Each LDMOS comprises a continuous field plate formed at least partially on the thick insulation layer over each of the one or more LDMOS devices and in conductive contact with the power device substrate area.

22 Claims, 3 Drawing Sheets

(51) Int. Cl.
*H01L 29/06* (2006.01)
*H01L 29/40* (2006.01)
*H01L 29/10* (2006.01)

(52) U.S. Cl.
CPC .......... *H01L 29/401* (2013.01); *H01L 29/404* (2013.01); *H01L 29/66681* (2013.01)

(58) Field of Classification Search
CPC ......... H01L 2924/13091; H01L 29/808; H01L 29/7835; H01L 29/66901; H01L 29/1066; H01L 29/78; H01L 29/0615; H01L 29/0661; H01L 29/0865; H01L 29/0886; H01L 29/41725; H01L 29/4238; H01L 29/0878; H01L 29/0684; H01L 29/0834; H01L 29/73; H01L 29/8086; H01L 29/7811; H01L 29/0619; H01L 29/0649; H01L 29/0653; H01L 29/7832; H01L 29/0847; H01L 29/66659; H01L 29/7838; H01L 29/0843; H01L 29/0882; H01L 29/1083; H01L 29/41758; H01L 29/42316; H01L 29/6606; H01L 29/66893; H01L 29/66568; H01L 29/70; H01L 29/7424; H01L 29/7809; H01L 29/80; H01L 2924/1305; H01L 2924/13055; H01L 2924/13062; H01L 27/0259; H01L 27/0266; H01L 27/0623; H01L 27/098; H01L 27/0617; H01L 27/088; H01L 21/02697; H01L 21/761; H01L 21/8232
USPC ....... 257/339, 335, 336, 343, 369, 408, 409, 257/481, 104, 493, 548
See application file for complete search history.

(56) References Cited

U.S. PATENT DOCUMENTS

| | | |
|---|---|---|
| 9,111,919 B2 | 8/2015 | Lichtenwalner et al. |
| 9,142,668 B2 | 9/2015 | Cheng et al. |
| 9,236,433 B2 | 1/2016 | Pala et al. |
| 9,240,476 B2 | 1/2016 | Pala et al. |
| 9,306,061 B2 | 4/2016 | Cheng et al. |
| 9,318,597 B2 | 4/2016 | Pala et al. |
| 9,331,197 B2 | 5/2016 | Pala et al. |
| 9,425,265 B2 | 8/2016 | Brunt et al. |
| 9,484,413 B2 | 11/2016 | Brunt et al. |
| 9,515,199 B2 | 12/2016 | Brunt et al. |
| 9,570,585 B2 | 2/2017 | Cheng et al. |
| 9,741,842 B2 | 8/2017 | Pala et al. |
| 9,768,259 B2 | 9/2017 | Suvorov et al. |
| 9,972,677 B2 | 5/2018 | Brunt et al. |
| 2004/0232522 A1* | 11/2004 | Shimizu ................ H01L 21/763 257/548 |
| 2007/0085595 A1* | 4/2007 | Taki ...................... H01L 27/092 327/534 |
| 2009/0179276 A1* | 7/2009 | Voidman ......... H01L 21/823814 257/369 |
| 2018/0069083 A1 | 3/2018 | Suvorov et al. |
| 2018/0350978 A1* | 12/2018 | Kim ................... H01L 29/7816 |
| 2019/0096988 A1* | 3/2019 | Murukesan ......... H01L 29/0634 |
| 2019/0259751 A1* | 8/2019 | Pala ................ H01L 21/823418 |

OTHER PUBLICATIONS

Tomohide Terashima et al., "A New Level-shifting Technique by divided RESURF Structure", published in: Proceedings of 9th International Symposium on Power Semiconductor Devices and IC's, Date of Conference: May 26-29, 1997, IEEE, Weimar, Germany.

* cited by examiner

US 11,069,804 B2

INTEGRATION OF HVLDMOS WITH SHARED ISOLATION REGION

FIELD OF THE INVENTION

Aspects of the present disclosure relate to high voltage semiconductor devices and the manufacturing process thereof and, in particular, to a Power device having lateral double-diffused metal-oxide-semiconductor (LDMOS) transistors with shared continuous isolation region.

BACKGROUND OF THE INVENTIONS

Lateral double-diffused metal-oxide-semiconductor (LDMOS) transistors are commonly used in high-voltage applications (20 to 1200 volts) because of their high breakdown voltage characteristics and compatibility with low voltage CMOS technology. In general, an N-type LDMOS transistor includes a polysilicon gate, an N+ source region formed in a P-type body region, and an N+ drain region. The N+ drain region is separated from the channel formed in the body region under the polysilicon gate by an N drift region. It is well known that by increasing the length of the N-drift region, the breakdown voltage of the LDMOS transistor can be accordingly increased.

High voltage power devices often have one or more LDMOS transistors and it may be necessary to isolate the high voltage terminals (drains) of the LDMOS devices from each other, such that each device is able to conduct current independently. FIG. 1A depicts a top down view of a power device having a plurality of LDMOS transistors 105 and a high voltage well 113. The LDMOS transistors 105 are integrated to the isolation region of the high voltage well. Each transistor is isolated from the power device substrate area 101 and the tub of the high voltage well 113 by an isolator structure 103. To reduce electric field crowding a plurality of floating conductive rings 106 that are continuous around the high voltage region of the power device and run over top the thick insulator layer and pass through the isolator structure 103.

FIG. 1B is a cross-sectional diagram showing an existing LDMOS device 100 provided as a high voltage N-channel Lateral DMOS (LDMOS). This type of device can be formed in an N-type epitaxial layer, a P-type epitaxial layer or a P-type substrate. The N-channel LDMOS device 100 formed in either an epitaxial layer or a P-type substrate 112 includes a N+ source region 109 disposed in a P-well body region 114 and a N+ drain contact pickup region 111 over top a deep drain region 122 disposed in an N− deep well region 107. A P+ body pickup region 108 is also formed on a top portion of the P-well body region 114 laterally adjacent to the source region 109. A thick insulator layer 110 is formed on a top portion of the deep well region 107 right next to the drain contact pickup region 111 and an insulated gate 104 disposed on top of the P-well body region 114. The deep well region 107 extends from overlapping a portion of the source region 109 through overlapping a portion of the thick insulator layer 110. A P type reduced surface field (RESURF) region 115 is formed in the deep well region A thin gate oxide (not shown) electrically insulates the gate 104 from the substrate 112. When an appropriate voltage is applied to the gate 104, an active channel 126 forms in the P-well body region underneath the gate 104 from the source region 109 to the P-N junction between the P-well body region 114 and the deep well region 107. The isolation insulator 103 lies over an isolator structure 127, which separates the high voltage LDMOS transistor 105 from the rest of the device. The isolator structure, which is basically, an opening in the N-well 107 is not present in the substrate area 116. Also shown are the contacts for the source 119, the gate 117, the drain 118 and the power device substrate 120.

Turning again to FIG. 1A, each transistor in the plurality of LDMOS transistors 105 has a separate insulated gate 104 that is non-continuous with field plates 102 of the power device. In other words, the insulated gates 104 of the LDMOS transistors 105 interrupt the field plates 102.

FIG. 1C show a cross sectional view of the isolator structure in the power device. As shown, the thick insulator layer 110 extends nearly the entire length of the isolator structure and separates the LDMOS device from the heavily doped substrate area 101 and the lightly doped substrate area underneath 116. The floating electrically conductive rings 106 sit over top the thick insulator layer 110. The field plate 102 does not extend over this region and the thick insulator layer 110. As a result, the semiconductor is exposed and is susceptible to induced charges and/or field crowding during high voltage operation.

This prior art device design is susceptible to failure modes due to field crowding and hot carrier injection. Additionally due to the design considerations of the gate region 104 and floating electrically conductive rings 106, metal leads cannot run over the isolation structure due to charge accumulation.

It is within this context that embodiments of the present invention arise.

BRIEF DESCRIPTION OF THE DRAWINGS

Other objects and advantages of the invention will become apparent upon reading the following detailed description and upon reference to the accompanying drawings in which.

DESCRIPTION OF THE SPECIFIC EMBODIMENTS

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the figure(s) being described. Because components of embodiments of the present invention can be positioned in a number of different orientations, the directional terminology is used for purposes of illustration and is in no way limiting. It is to be understood that other embodiments may be utilized and structural or logical changes, including changes in the order of process steps, may be made without departing from the scope of the present invention. The following detailed description, therefore, is not to be taken in a limiting sense, and the scope of the present invention is defined by the appended claims.

The Device

The discontinuous field plates in the prior art power device create regions where field crowding and charge carrier injection is possible. Specifically the exposed thick insulator in the isolation region allows for field crowding and charge injection to occur on the edge of the field plates and gates. According to aspects of the present disclosure, field crowding and charge carrier injection may be reduced in LDMOS devices by separating the insulated gates of each LDMOS transistor in the power device from the field plates and creating a continuous field plate around the high voltage region of the power device.

Figures 2A, 2B, 2C:
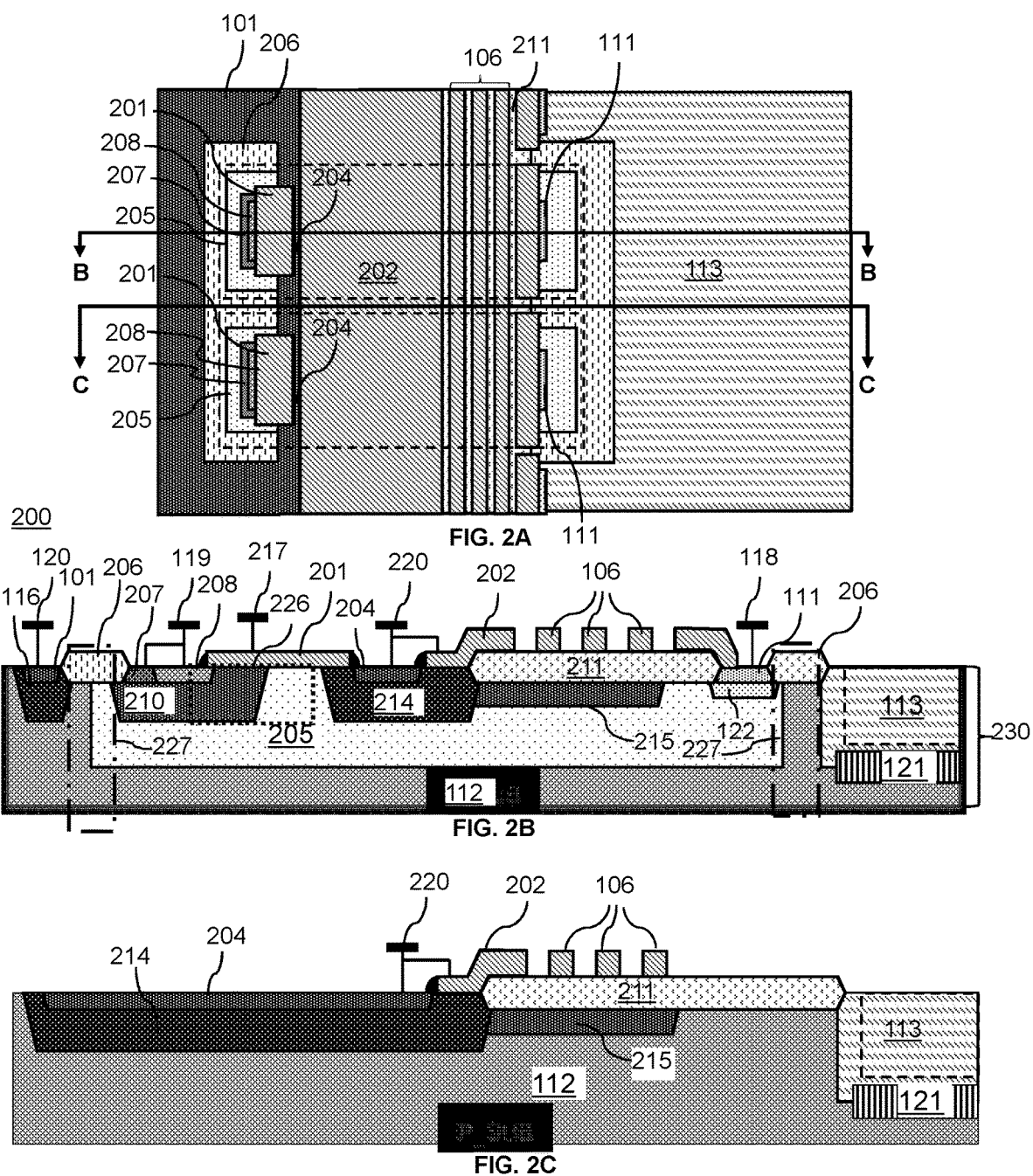
FIG. 2A is a top down schematic diagram of the portion of a power device having one or more N-Channel LDMOS devices with shared continuous isolation region and guardian region integrated in the isolation region of a high voltage well according to aspects of the present disclosure.
FIG. 2B is a cross-sectional schematic diagram illustrating an N-Channel LDMOS device with shared continuous isolation region and guardian region integrated in the isolation region of a high voltage well according to aspects of the present disclosure taken along line B-B of FIG. 2A.
FIG. 2C is a cross-sectional schematic diagram of a conventional isolator structure in a power device having one or more N-Channel LDMOS devices with shared continuous isolation region and guardian region according to aspects of the present disclosure taken along line C-C of FIG. 2A.

FIG. 2A illustrates an implementation of an improved power device in which LDMOS devices are integrated to the isolation region of a high voltage well according to aspects of the present disclosure. The field plate 202 in this power device is separated from the insulated gates 201 of the LDMOS devices. The field plate 202 is continuous over the LDMOS devices and connected to the substrate area of the power device 101. The continuous field plate 202 as such reduces field crowding and hot carrier injection. A guardian pick up region 204 in conductive contact with the power device substrate area 101 may further reduce the occurrence of field crowding and hot carrier injection in some implementations.

FIG. 2B is a schematic diagram illustrating a possible implementation of integration of N-channel LDMOS device 200 into the isolation region of a high voltage well 113 according to an aspect of the present disclosure. The N-channel LDMOS device 200 formed in a P-type substrate 112 includes a N+ source region 208 disposed in a P-well body region 210 and an N+ drain contact pickup region 111 disposed on top of an (optional) deep drain region 122 in the deep well region 205. A P+ body pickup region 207 is also formed on a top portion of the P-well body region 210 adjacent to the source region 208. A thick insulator layer 211 is formed on a top portion of the deep well region 205 right next to the drain contact pickup region 111. An insulated gate 201 is disposed on top of the P-well body region 210 and the deep well region 205 and extends from overlapping a portion of the source region 208 to overlapping a portion of the guardian well region 214. The gate 201 may be electrically insulated from the substrate composition 230 by a thin gate oxide (not shown). When an appropriate voltage is applied to the gate 201, a channel region 226 forms in the body region underneath the gate 201, and extends from the source region 119 to the P-N junction between the P-well body region 112 and the deep well region 205. The guardian well region 214 is formed between the thick insulator layer 211, RESURF region 215 and the body region 210 in the deep well region 205. The guardian well region may be lightly doped with the first conductivity type. In this example the deep well region 205 would be a lightly doped N-region. The field plate 202 is formed over an upper portion of the guardian well region 214. The continuous field plate 202 may overlap the guardian well region 214 and be in conductive contact with those regions. In some implementations, the field plate is in conductive contact with the substrate area 220 by means such as a metal lead contact or an uninsulated area in contact with the substrate area 101 etc. The continuous field plate 202 may be constructed from a conductive material such as polysilicon or a metal. Placement of the continuous field plate 202, as discussed above may be over top the thick insulator layer 211 and the RESURF region 215 underneath the thick insulator layer. A portion of the insulated gate layer 201 may also overlap the guardian well region 214. As seen a gate electrode 217 is in conductive contact with the insulated gate.

Figure 1A:
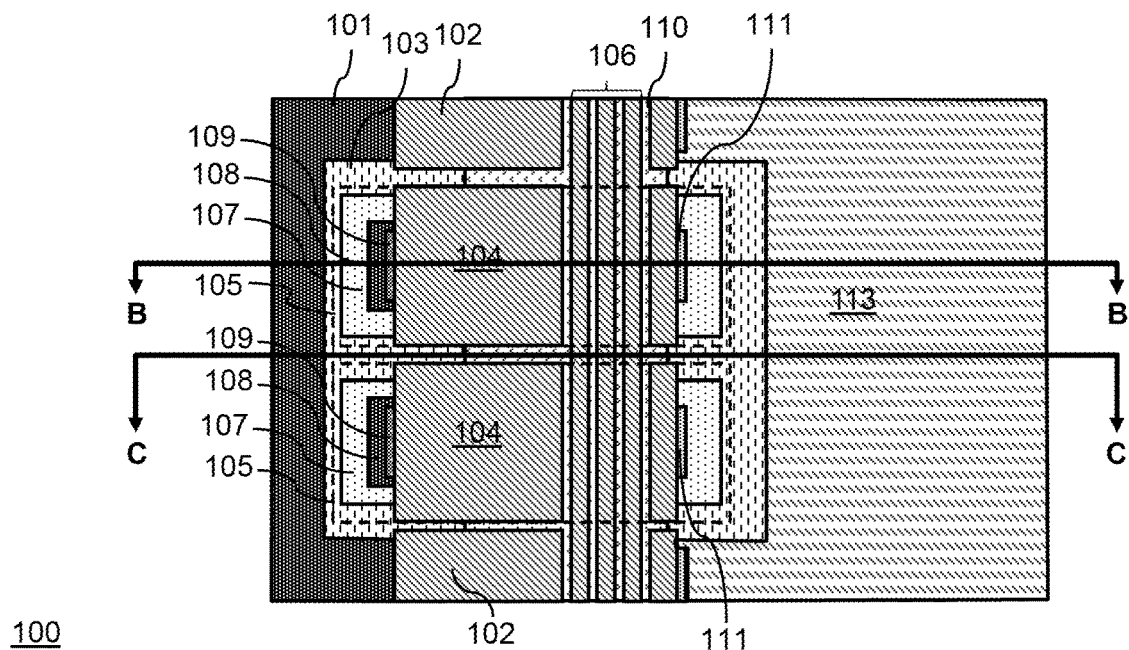
FIG. 1A is a top down schematic diagram of the portion of a power device having one or more conventional N-Channel LDMOS devices integrated in the isolation region of a high voltage well.
Figure 1B:
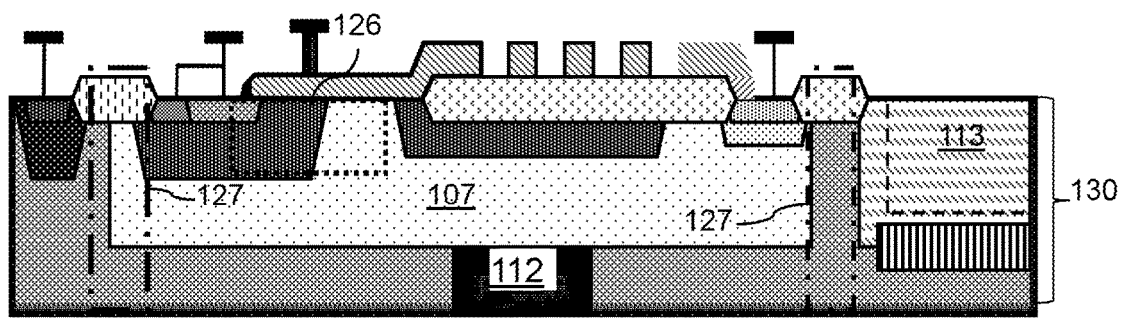
FIG. 1B is a cross-sectional schematic diagram illustrating a conventional N-channel LDMOS device in a power device integrated in the isolation region of a high voltage well taken along line B-B of FIG. 1A.
Figure 1C:
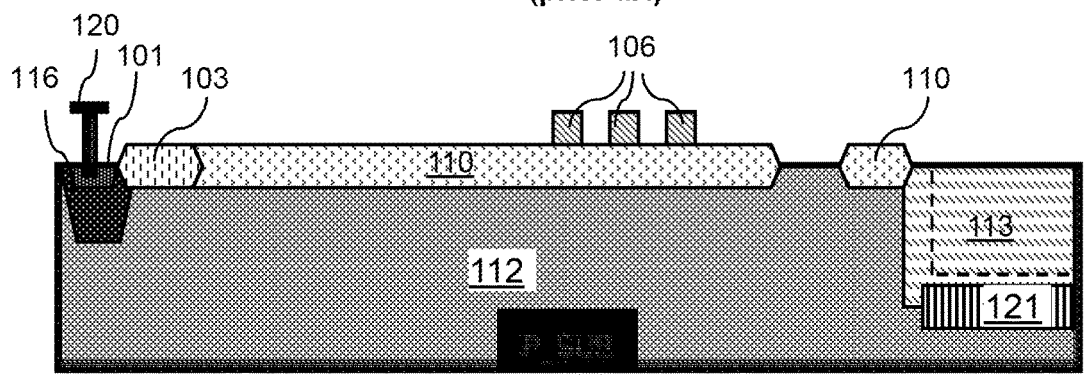
FIG. 1C is a cross-sectional schematic diagram of a conventional isolator structure in a power device having one or more N-Channel LDMOS devices integrated in the isolation region of a high voltage well taken along line C-C of FIG. 1A.

FIG. 2C shows a cross section side view in the isolator region of the improved power device according to aspects of the present disclosure. In contrast with the prior art device, the guardian well region 214 expands to fill a length of the isolator region 227 and is formed in the substrate 112. The field plate 202 remains continuous over the thick insulator at the substrate area of the power device 101, over the isolator structure and over the LDMOS devices. The field plate 202 and the guardian well region 214 are in conductive contact with the power device substrate area 220. The addition of the continuous field plate 202 and guardian well region 214 in the isolator structure 227 reduces unprotected edges of the thick insulator layer 211 where field crowding and carrier injection may take place. Other structures in the LDMOS device shown in FIGS. 2A-C remain similar to the device shown in FIGS. 1A-C.

Figure 3A:
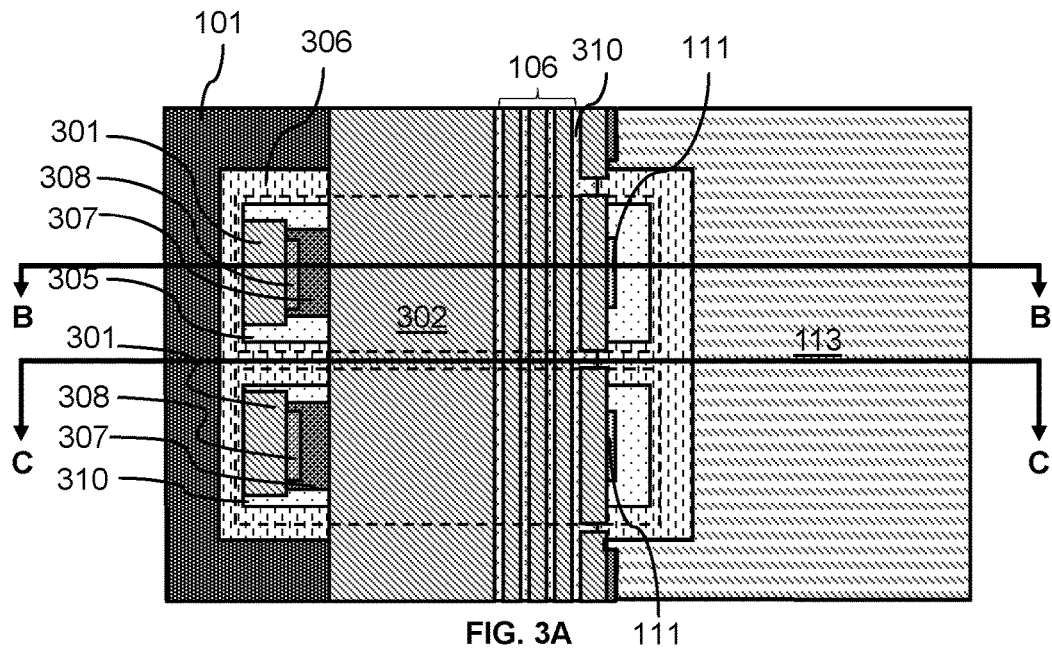
FIG. 3A is a top down schematic diagram of the portion of a power device having one or more N-Channel LDMOS devices with shared continuous isolation region and body contact guardian region according to aspects of the present disclosure.
Figure 3B:
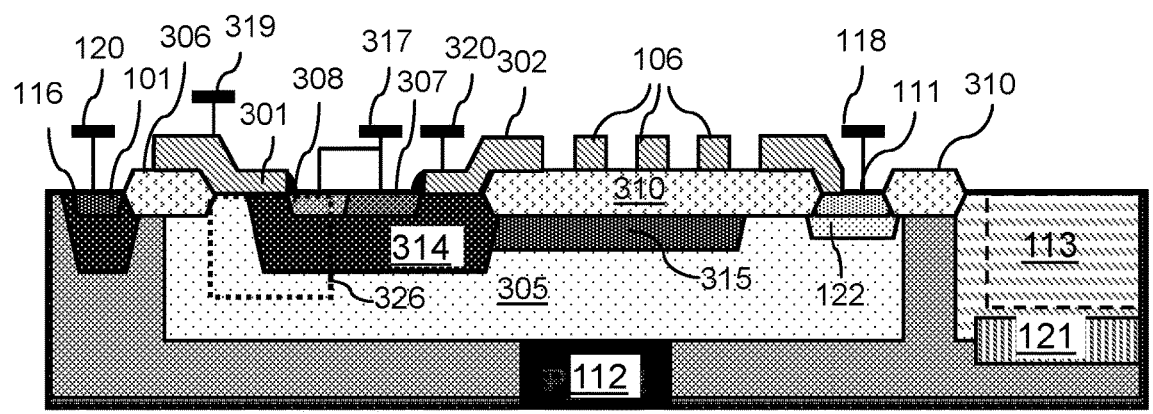
FIG. 3B is a cross-sectional schematic diagram illustrating an N-Channel LDMOS device with shared continuous isolation region and body contact guardian region according to aspects of the present disclosure taken along line B-B of FIG. 3A.
Figure 3C:
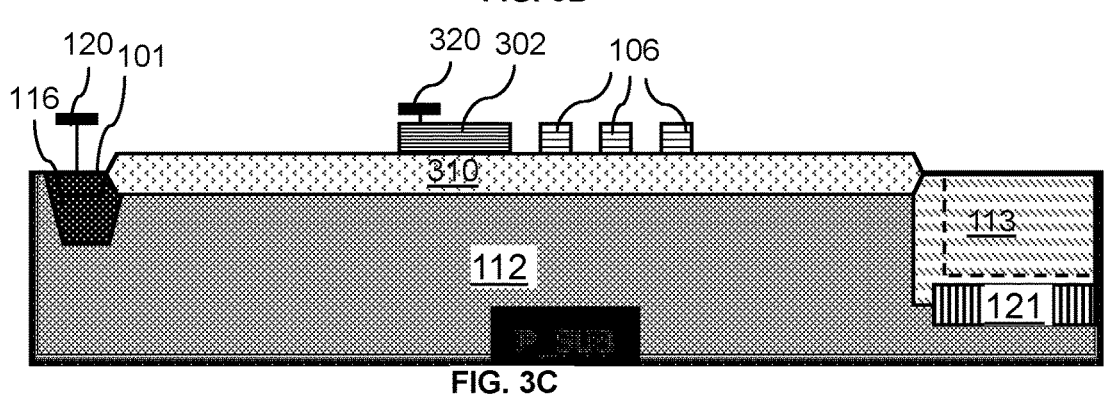
FIG. 3C is a cross-sectional schematic diagram of a conventional isolator structure in a power device having one or more N-Channel LDMOS devices with shared continuous isolation region and body contact guardian region according to aspects of the present disclosure taken along line C-C of FIG. 3A.

In alternative implementations of the present disclosure further space may be saved by using the body pickup region 317 and well body region 314 as guardian regions, depicted by FIGS. 3A-C. In this implementation, the positions of the body pick up region 317 and the source pick up region 308 have been switched such that the body pick up region 317 is proximate the continuous field plate 302. The insulated gate layer is located on the opposite side of the body region 314 from the field plate 302. Turning to FIG. 3B, the insulated gate 301 overlaps a portion of the isolation insulator 305, a portion of the deep well region 305, a portion of the body region 314 and a portion of the source pick up region 308. Thus, an active channel 326 forms under the insulated gate 301 between the source pick up region 308 and the isolator structure on the side of the well body region opposite the thick insulator layer 310 when an appropriate voltage is applied to the gate. The thick insulator layer 310 in this implementation is adjacent to the body region 314 and may run over top a portion of the body region. Similarly, the RESURF region 315 is located next to the body region 314 and underneath the thick insulator layer 310. The continuous field plate 302 is located over a portion of the body contact pick up region 307, body region 314 and the thick insulator layer 310. As shown in FIG. 3B and FIG. 3C, the field plate 302 is in conductive contact with power device substrate area 320. The source contact 317 is in conductive contact with the source pick up region 308 and the body contact pick up region 307. Likewise, the gate electrode 319 is shifted to opposite side of the body region 314 from the field plate 302 to match the gate 301.

FIG. 3C shows a cross section of the power device in the isolator region according to aspects of the present disclosure. The thick insulator layer 310 in this implementation runs the length of the LDMOS device between the tub of the high side driver 113 and the edge of the power device substrate areas 101, 116. The continuous field plate 302 runs over top the thick insulator layer 310 in the isolator region 306 and is continuous with the field plate in in the LDMOS device and over the substrate area. The continuous field plate is in conductive contact with the substrate area 320 through, by way of example and without limitation, physical contact or a metal lead connecting the field plate to the power device substrate area, e.g., though metal lines. The addition of the continuous field plate serves to reduce edges that allow field crowding and carrier injection to occur.

Fabrication

The Power devices shown in FIGS. 2A-C and 3A-C can be manufactured using conventional methods for manufacturing a conventional LDMOS, with some additional steps.

In a conventional process, an N-channel LDMOS, is typically formed from a silicon P− substrate 112 with either N-type or P-type epitaxial layer or without epitaxial layer supported on the substrate.

N-type implantation forms a deep well region 107. After the N-type implantation that forms the deep well region, a thick insulator (e.g., oxide) layer 110 is formed on a surface of the substrate composition 130. The thick oxide layer is formed next to the guardian well region 214 and extends to a location where the drain region or (optionally) the deep drain region 122 will be subsequently formed. The thick oxide layer 110 may be formed using a local oxidation of silicon (LOCOS) process. In alternative implementations etchback and trenchfill using CVD may also be used. A subsequent P-type implant forms a body region 114 at upper portions of the deep well region 107. Optionally a lightly doped deep drain region 122 may be formed in an upper portion of the deep well region 107 at this time. According to the implementation shown in FIGS. 2A-C a P-type guardian well region 214 is formed in an upper region of the deep well region 205 after forming the thick insulator 110 and a heavily doped P-type guardian pick up region 204 is formed in the an upper portion of the guardian well region 214. The guardian pick up region 204 is more heavily doped than the guardian well region 214. The P-type RESURF region 215 may also be formed adjacent to the guardian well region.

Next, a gate electrode 201 can be formed on the surface substrate composition 130 overtop a thin gate oxide layer. In implementation shown in FIGS. 2A-B the gate 201 gate may be formed over a portion of the body region 210 and a portion of the gate region 214 by deposition and patterning of conductive material, such as polysilicon or metal, e.g., aluminum or copper. The continuous polysilicon field plate 202 located on the edge of the thick insulator layer 211 overlapping the guardian well 214 region may be formed in the same deposition and patterning process as the gate 201. The field plate may be in conductive contact with the guardian regions. By way of example, and not by way of limitation, the conductive material form the gate 201 and field plate 202 may be deposited by physical vapor deposition (PVD). The metal may be blanket deposited and subjected to patterned etching to form the gate electrode 201 and field plate 202. Implementations of FIGS. 3A-B show the insulated polysilicon gate 301 is formed over top the isolator insulation 306 and the body region 314. The gate 201 may be insulated by forming an oxide layer on the surface of the substrate composition and then forming the gate on top of the oxide layer, a second layer of oxide may be formed on top of the gate to isolate it from any other conductive layer placed on the device. The continuous field plate 302 may be grown on a portion of the thick insulator layer 310 and overlap a portion of the body region 314. The field plate 302 is in conductive contact with the substrate area of the power device. In both implementations of FIGS. 2A-C and 3A-C the field plate 202 and 302 respectively, is continuous through the isolator region and around the high voltage region of the power device. Additionally conductive electrically floating rings 106 may be formed from polysilicon on the thick insulator layer 110. The conductive electrically floating 106 are continuous around the high voltage region of the power device as well.

A Source region 208 doped with the high concentration N-type dopants can be formed in a region adjacent to the P+body pickup region 207 in the surface of the P-well body region 210, e.g., by implantation through a mask or by mask-less implantation. A drain contact pickup region 111 also doped with the high concentration N-type dopants is formed in the surface of the deep well region 205. As a result, the source region 109 and the drain contact pickup region 111 are formed on opposite sides of the thick insulator 211 and isolated from each other. It should be noted that, placement of the deep well region 205, the source region 208, the body region 210, the body pick up region 207 and the drain contact pickup region 111 create the isolator structure 127 within the substrate layer that isolates the LDMOS device from a substrate area of the power device. Isolator insulation 206 may be deposited on the surface of the substrate composition 230 at the isolator structure 227. The isolator insulation 206 may be any resistive material for example an oxide layer grown on the surface of the substrate composition. While the formation of these regions has been explained with respect to FIG. 2A, FIG. 2B and FIG. 2C it should be understood that the process for creation of these regions for the implementation discussed in FIG. 3A, FIG. 3B and FIG. 3C is substantially the same with only the location of the regions within the substrate differing.

Formation of the source contact region 208 in implementations depicted in FIGS. 2A-B sets the source contact region 208, body pickup region 207 and well body region 210 further from the thick insulating layer 211 to accommodate the additional guardian structures. For implementations depicted in FIGS. 3A-B the location of the source contact region 308 and the body contact pick up 307 are switched with respect the thick insulator layer 310. As shown, the source contact region 308 is proximal to the isolator structure 306 instead of the thick insulator layer 310. The gate, body, source and drain electrodes are thus formed to complete the device. Additionally in some implementations substrate electrodes may also be formed. Finally metal interconnects may be formed on the surface of the device.

It should be noted that the above technique is described with regard to an N-type LDMOS device, can be applied to both N-type and P-type LDMOS.

While the above is a complete description of the preferred embodiments of the present invention, it is possible to use various alternatives, modifications, and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A" or "An" refers to a quantity of one or more of the item following the article, except where expressly stated otherwise. The appended claims are not to be interpreted as including means-plus-function limitations, unless such a limitation is explicitly recited in a given claim using the phrase "means for". Any element in a claim that does not explicitly state "means for" performing a specified function, is not to be interpreted as a "means" or "step" clause as specified in 35 USC § 112¶ 6.

What is claimed is:

1. A power device, comprising:
   a) a semiconductor substrate composition having a substrate layer of a first conductivity type;
   b) two or more lateral double diffused metal oxide semiconductor (LDMOS) devices formed in the substrate layer and integrated into an isolation region of a high voltage well, wherein each LDMOS is isolated from a power device substrate area by an isolator structure formed from the substrate layer and wherein each LDMOS includes:
      a deep well region of a second conductivity type opposite the first conductivity type formed in the substrate layer,
      a source region, a body region and a drain contact pickup region formed in the deep well region, wherein the body region is of the first conductivity type, the source region is of the second conductivity type and the drain contact pickup region is of the second conductivity type;
      a body pickup region formed in the body region and laterally adjacent to the source region, wherein the body pickup region is of the first conductivity type but more heavily doped than the body region,
      an insulated gate layer formed on top an active channel region, the active channel being located in the body region between the source region and a junction between the body region and the deep well region,
      an insulation layer formed on top of the substrate composition between the body region and the drain contact pickup region;
      a RESURF region of the first conductivity type located directly underneath the insulation layer;
   c) a continuous field plate formed at least partially on the insulation layer over each of the two or more LDMOS devices and in conductive contact with the power device substrate area, wherein the continuous field plate is continuous over each of the two or more LDMOS devices; and
   d) a plurality of conductive electrically floating rings formed on top the insulation layer, wherein the plurality of conductive electrically floating rings are continuous over the isolator structure and the power device substrate area.

2. The device from claim 1, further comprising a guardian well region of the first conductivity type formed in the deep well region and in conductive contact with the power device substrate area.

3. The device from claim 2, wherein the guardian well region is formed between the channel region and the drain contact pickup region.

4. The device from claim 2, further comprising a guardian pick up region formed on top of the guardian well region, in conductive contact with the power device substrate and more heavily doped with the first conductivity type than the guardian well region.

5. The device from claim 2, wherein the insulated gate layer and the field plate are in contact with the guardian well region.

6. The device of claim 1, wherein the RESURF region of the first conductivity type is formed between the body region and the drain contact pickup region underneath the insulation layer.

7. The device of claim 6, wherein the RESURF region is between a guardian well region of the first conductivity type and the drain contact pickup region, wherein the guardian well region is formed in the deep well region and in conductive contact with the power device substrate area.

8. The device of claim 1, wherein a deep drain region of the first of the second conductivity type is formed underneath the drain contact pickup region.

9. The device of claim 1, wherein the insulated gate layer is on the opposite side of the body region from the field plate.

10. The device of claim 9, wherein the body pickup region is closer to the field plate than the source contact pick up region.

11. The device of claim 10, wherein the body pickup region serves as a guarding well.

12. A method for making a lateral double diffused metal oxide semiconductor (LDMOS) device in a power device, the method comprising:
   forming two or more lateral double diffused metal oxide semiconductor (LDMOS) devices formed in the substrate layer and integrated into an isolation region of a high voltage well, wherein each LDMOS is isolated from a power device substrate area by an isolator structure formed from the substrate layer and wherein forming each LDMOS includes:
   a) in a semiconductor substrate composition having a substrate layer of a first conductivity type, forming a deep well region of a second conductivity type opposite the first conductivity type in the substrate layer;
   b) forming a source region, a body region and a drain contact pickup region formed in the deep well region, wherein the body region is of the first conductivity type, the source region is of the second conductivity type and the drain contact pickup region is of the second conductivity type;
   c) forming a body pickup region in the body region and laterally adjacent to the source region, wherein the body pickup region is of the first conductivity type but more heavily doped than the body region wherein the placement of the deep well region, the source region, the body region, the body pick up region and the drain contact pickup region create an isolator structure with in the substrate layer that isolates the LDMOS device from a substrate area of the power device;
   d) forming an insulated gate layer on top an active channel region, the active channel being located in the body region between the source region and a junction between the body region and the deep well region;

e) forming an insulation layer on top of the substrate composition between the body region and the drain contact pickup region;

forming a RESURF region of the first conductivity type located directly underneath the insulation layer;

forming a continuous field plate at least partially on the insulation layer over each of the two or more LDMOS devices and in conductive contact with the substrate area of the power device; and forming a plurality of conductive electrically floating rings on top the insulation layer, wherein the plurality of conductive electrically floating rings are continuous over the isolator structure and the substrate area of the power device.

13. The method of 12, further comprising forming a guardian well region of the first conductivity type in the deep well region and wherein the guardian well is in conductive contact with the substrate area of the power device.

14. The method of claim 13, wherein the guardian well region is formed between the channel region and the drain contact pickup region.

15. The method of claim 13, further comprising forming a guardian pick up region on top of the guardian well region, in conductive contact with the substrate area of the power device and more heavily doped with the first conductivity type than the guardian well region.

16. The method of claim 13, wherein the insulated gate layer and the field plate are in electrical contact with the guardian well region.

17. The method of claim 12, wherein the RESURF region of the first conductivity type is formed between the body region and the drain contact pickup region underneath the insulation layer.

18. The method of claim 17, wherein the RESURF region is between the guardian well region and the drain contact pickup region.

19. The method of claim 12, further comprising forming a deep drain region of the first of the second conductivity type underneath the drain contact pickup region.

20. The method of claim 12, wherein the insulated gate layer is on the opposite side of the body region from the field plate.

21. The method of claim 20, wherein the body pick up region is closer to the field plate than the source contact pick up region.

22. The method of claim 21, wherein the body pick up region serves as a guarding well.

* * * * *